United States Patent [19]

Schöberl

[11] 4,058,750

[45] Nov. 15, 1977

[54] LIGHT EMITTING SEMICONDUCTOR INDICATING STRUCTURE WITH LIGHT CONDUCTORS

[75] Inventor: Werner Schöberl, Massenbachhausen, Germany

[73] Assignee: Licentia Patent-Verwaltungs-G.m.b.H., Frankfurt am Main, Germany

[21] Appl. No.: 725,083

[22] Filed: Sept. 20, 1976

[30] Foreign Application Priority Data

Sept. 20, 1975 Germany .............................. 2542095

[51] Int. Cl.$^2$ ...................... H05B 33/02; H05B 33/20
[52] U.S. Cl. ..................................... 313/500; 313/111; 313/510; 313/512; 357/80
[58] Field of Search ............... 313/499, 500, 513, 512, 313/510, 511; 357/80, 72, 74; 174/52 FP, 52 PE, 50.52

[56] References Cited

U.S. PATENT DOCUMENTS

| | | | |
|---|---|---|---|
| 3,555,335 | 1/1971 | Johnson | 313/499 |
| 3,676,668 | 7/1972 | Collins et al. | 313/512 X |
| 3,684,817 | 8/1972 | Card et al. | 174/50.52 X |
| 3,780,357 | 12/1973 | Haitz | 313/499 X |
| 3,786,499 | 11/1972 | Jankowski et al. | 313/500 X |
| 3,876,900 | 4/1975 | Amatsuka et al. | 313/500 X |
| 3,904,262 | 9/1975 | Cutchaw | 174/52 FP X |

Primary Examiner—Palmer C. Demeo
Attorney, Agent, or Firm—Spencer & Kaye

[57] ABSTRACT

A semiconductor indicating arrangement comprises a structured contact strip on which are mounted a plurality of luminescent semiconductor elements connected by one electrode to the contact strip and connected by their other electrode to another part of the contact strip, a homogeneous plastic substance embedding the semiconductor element and the contact strip except for outer connecting parts thereof and forming a base and a light conductor above each semiconductor element and a covering casing surrounding the base of the light conductors.

19 Claims, 6 Drawing Figures

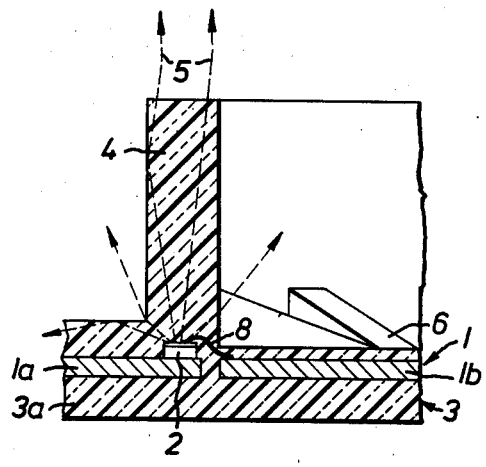
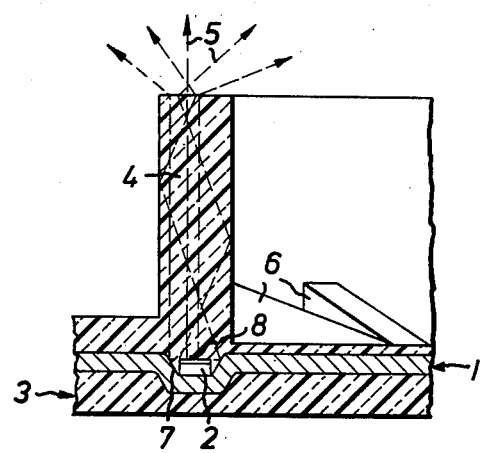
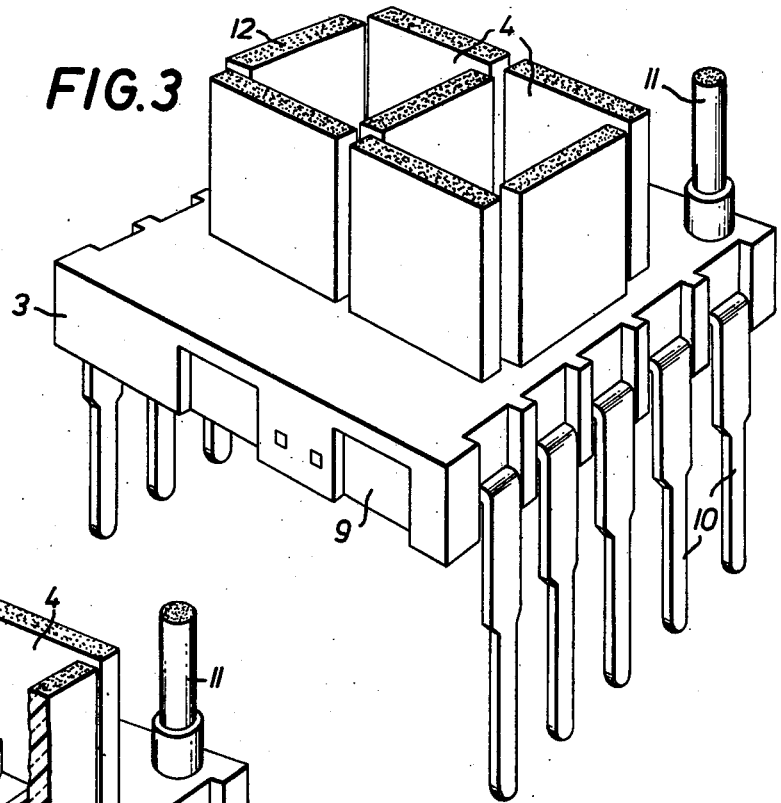
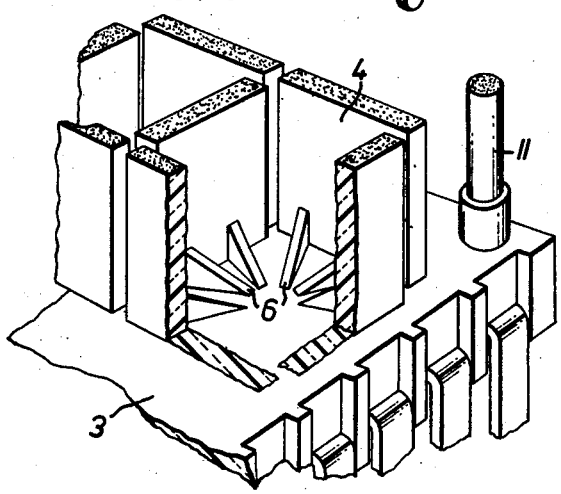

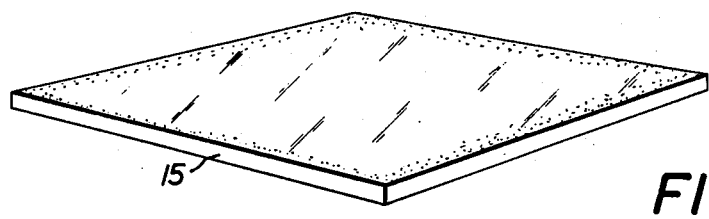
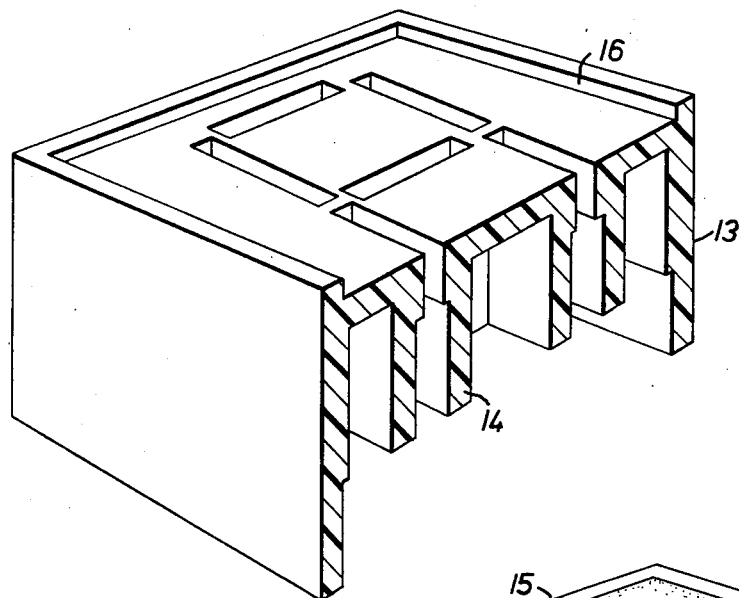
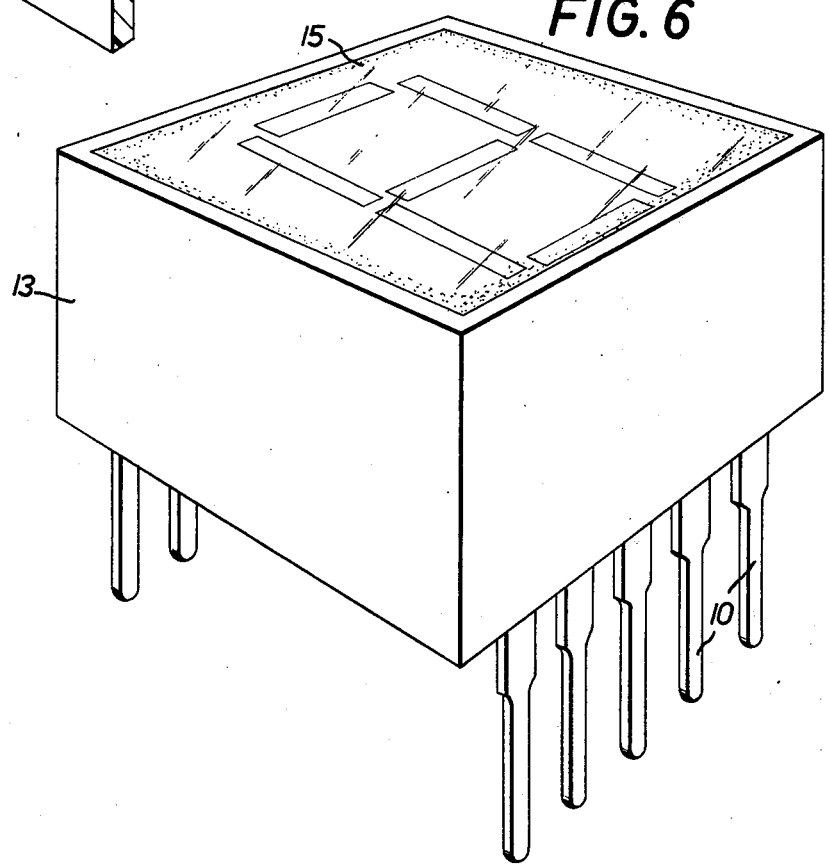

LIGHT EMITTING SEMICONDUCTOR INDICATING STRUCTURE WITH LIGHT CONDUCTORS

BACKGROUND OF THE INVENTION

The invention relates to a semiconductor arrangement for indicating characters such as digits by means of semiconductor luminiscent elements. These semiconductor arrangements are known, in which the semiconductor bodies are arranged on a ceramic plate in the form of a 日. The ceramic plate is then cast into a plastic substance together with light conductors arranged over the semiconductor elements, the pastic substance at the same time forming the casing or a part of the casing.

SUMMARY OF THE INVENTION

It is an object of the invention to provide a semiconductor arrangement which may be manufactured industrially in a simple and inexpensive manner.

It is a further object of the invention to provide a semiconductor arrangement in which the respective selected digit may be read off without error.

According to the invention, there is provided a semiconductor arrangement for producing illuminated characters comprising a structured contact strip, a plurality of luminescent semiconductor elements mounted on the strip for electrical connection therewith by first electrodes, means connecting second electrodes of said semiconductor elements to another part of said strip, a homogeneous plastic material embedding said contact strip but leaving outer connecting parts protruding and forming a base and a light conductor above each said semiconductor element and a casing hood surrounding said base and said light conductors.

Further according to the invention, there is provided a semiconductor arrangement for indicating digits by means of semiconductor illuminating elements characterized in that the illuminating elements are arranged on a structured contact strip and are electrically connected to parts of said contact strip; that said contact strip is embedded in a homogeneous plastic substance with the exception of the outer connecting parts said plastic substance forming a baseplate having plate-shape extensions running perpendicular to the base-plate, wherein said plate-shaped extensions acting as light conductors are arranged over said illuminating elements; that a casing hood is provided for terminating the whole arrangement, said casing hood being provided with a filter plate as a covering plate.

BRIEF DESCRIPTION OF THE DRAWINGS

The invention will now be described in greater detail, by way of example, with reference to the drawings, in which:

FIG. 1 is a section through a light conductor and a part of the baseplate in accordance with the invention;

FIG. 2 is a view similar to FIG. 1 but showing a modified form;

FIG. 3 shows a baseplate in perspective view having light conductors perpendicular thereto;

FIG. 4 makes visible the support cross-pieces between the individual light conductors;

FIG. 5 shows the casing hood cut away and the filter plate and

FIG. 6 shows the entire finished arrangement.

DESCRIPTION OF THE PREFERRED EMBODIMENT

In a preferred embodiment of the invention, in a lighting arrangement as mentioned at the outset the lighting elements are arranged on a structured contact strip and are electrically connecting to parts of the contact strip; the contact strip is embedded in a homogeneous plastic substance with the exception of the outer connection parts, said plastic substance forming a baseplate having plate-shaped extensions running perpendicular to the baseplate, wherein the plate-shaped extensions acting as light conductors are arranged over the luminescent elements; and a casing hood is provided as the termination of the entire arrangement, which cap is provided with a filter plate as a covering plate.

The plate-shaped extensions form light conductors, the beam-shaped end surfaces of which form an 日 in plan view. The end surfaces of the light conductors are roughened whereby, despite the large viewing angle available, optimum illumination of the light conductor end surfaces is made possible. The plastic substance comprises preferably polycarbonate to which 2 to 4% glass powder are added. As a result of these glass powder multiple reflections take place in the light conductor whereby even illumination of the light conductors results.

The light conductors are in contact, either directly or almost directly with the contact strip at their inside facing the other light conductors. The plastic layer on the contact strip is therefore extremely thin inside the 日.

In this manner crosstalk of a selected light conductor with an adjacent light conductor is prevented. In order to give the plate-shaped light conductors mechanical stability they are supported with respect to one another on their inner side by means of narrow webs made of the plastic substance, running along the baseplate. Preferably, these support webs for four light conductors forming a square have the shape of a star.

In order to improve the light yield the contact strip below the light conductors is burnished with a good reflective burnished silver layer. The light output may also be improved by impressing recesses into the contact strip into which the semiconductor elements are placed. These recesses then form a reflector for the light rays emitted laterally of the semiconductor element.

The baseplate formed by the plastic mass preferably has notches or projections on its side surfaces which rest in appropriate projections or notches in the casing hood. The casing hood is covered by a filter plate. This filter plate is so constructed that, when the semiconductor elements are not illuminated the light conductors may not be seen or may be seen only faintly. In order to achieve this effect, the casing hood is held at an appropriate colour tone. As a result it is ensured that even with unfavourable lighting conditions, error in readings may be eliminated.

The casing hood has separating webs running perpendicular to the baseplate on the inside, these being constructed so that all the light conductors are screened from one another. Also, as a result of this measure, undesirable cross-talk between adjacent ligthconductors is prevented.

The essential advantage of the semiconductor arrangement in accordance with the invention lies in the fact that the contrast ratios and the illumination of the light conductors have been substantially improved with respect to known arrangements. The proposed arrangement may be produced in a simple manner and in large numbers. By equipping the semiconductor arrangement accordingly with different components and by selecting the filter plate accordingly, the casing illustrated is suitable for red, yellow and green illuminated digit indicators.

Referring now to the drawings, in FIG. 1 a part of a contact strip 1 is shown which is necessary for connection of an individual semiconductor element or component. The semiconductor component 2 is fixed by one electrode, for example, to the strip part 1a. The other electrode of the component 2 is then connected by a thin contact wire 8 to a further part 1b of the contact strip. The illuminating elements 2 are usually luminous diodes made of gallium phosphide (GaP) or made of gallium-arsenide-phosphide (GaAsP). The metallic contact strip preferably has a burnished layer of silver on its surface facing the component 2. As a result, the light output is increased. A further increase in the light output is achieved if, in accordance with FIG. 2, a recess 7 is impressed into the contact strip 1. The semiconductor component 2 is inserted into this recess. The light rays 5 emitted by the semiconductor body are then partially reflected on the inner wall of the recess and are deflected into the light conductor 4.

FIGS. 1 and 2 moreover show how the semiconductor body and the contact strip are embedded in the plastic substance 3. The plastic substance forms a baseplate 3a and a plate-shaped extensions 4 running perpendicular to the baseplate, forming the light conductor. As is evident from FIGS. 1 and 2, this light conductor is seated at the inside almost directly on the contact strip 1 in order to prevent cross-talk with adjacent light conductors. The light conductors are then mechanically stabilized by means of support cross-pieces 6. On the outside of the light conductors on the other hand the plastic layer on the contact strip may be relatively thick. The plastic body of the type illustrated is preferably manufactured by means of injection moulding by using suitable moulds.

The luminous elements 2 have dimensions of approx. 0.4 × 0.4 mm. The end of the light conductors 4 on the other hand are approx. 1 × 5.5 mm. In order to achieve good illumination of the light conductors, glass powder is added to the plastic material. In particular, polycarbonate is used as a plastic material to which 2 to 4% of glass powder are added.

In FIG. 3 the entire baseplate is shown with all eight light conductors. Seven of these light conductors 4 are plate-shaped and are separated by means of narrow gaps respectively. The seven light conductors have the shape of a ⊓. A light conductors 11 is constructed cylindrically as a decimal point. This too comprises the same material as the baseplate. The baseplate and all lightconductors are manufactured in a homogeneous injection-moulding process. For example ten connecting tags 10 project from the base plate which are parts of the structured contact strip to which the eight lighting elements are fixed and electrically connected.

The end surface 12 of each of the plate-shaped light conductors 4 is roughened for even illumination. The roughening is obtained by means of an appropriate development of the injection-moulded blank. Recesses 9 may be seen in the baseplate 3 at the side surfaces in which recesses rest appropriate projections in the cup of the casing. Further locking measures are not necessary as the semiconductor components are completely embedded in the plastic material.

In FIG. 4 support webs 6 may be seen by which the inner surfaces of the plate-shaped light conductors 4 are supported with respect to one another on the baseplates. In a square comprisng four adjacent light conductors in each case, these support webs form a star, wherein for example two support webs respectively lead from the centre point of the star to each light conductor.

In FIG. 5 the casing hood 13 is shown cut open. This casing hood is provided inside with separating webs 14 between which recesses remain for the light conductors. These separating limbs engage in the gaps between the individual light conductors and thus screen the lightconductors from one another. On the end surface of the casing hood are provided recesses which correspond to the size and shape of the light conductors. This casing hood made of plastic is selected, for the purpose of increasing contrast, in a certain colour tone, with the colour tone being adapted to the filter plate so that the light conductors cannot be seen or can scarcely be seen in the non-illuminating state after the filter plate has been attached. For green and yellow illuminating semiconductor components the casing hood is, for example, grey; for red illuminating digits it may also be red.

The filter plate 15 is inserted into the casing hood into grooves 16 in the casing hood for example with the aid of a snap closure. The filter plate which serves to increase contrast, is approximately 0.4 mm thick and comprises for example a mixture of 10% glass powder and 90% polycarbonate as well as approximately 1% colour pigment. For red and yellow digit indicators cut-on filters or edge filters are preferred, while for green digit indicators there is practically only an interference filter.

In FIG. 6 the finished arrangement is shown. The casing hood 13 with the covering plate 15 made of the said filter plate was placed on the baseplate. The casing hood and baseplate are connected together by means of a snap closure (9). In FIG. 6 the lightconductors are shown for simplification although they may only be visible in the illuminated state, after the filter plate has been inserted.

As already mentioned the filter plate is selected according to whether the contact strip is equipped with red, green or yellow illuminating semiconductor elements. The arrangement in accordance with the invention thus has the substantial advantage that digit indicators of all illuminating colours may be manufactured with the same manufacturing techniques and the same casing parts.

It will be understood that the above description of the present invention is susceptible to various modification changes and adaptations.

What is claimed is:

1. A semiconductor arrangement for indicating digits by means of semiconductor illuminating components, characterized in that the illuminating components are arranged on a structured contact strip and are electrically connected to parts of said contact strip; that said contact strip is embedded in a homogeneous plastic substance with the exception of the outer connecting parts, said plastic substance forming a baseplate having plate-shaped extensions running perpendicular to the baseplate, wherein said plate-shaped extensions acting as light conductors are arranged over said illuminating components; that a casing hood is provided for terminating the whole arrangement, said casing hood being provided with a filter plate as a covering plate; and that said covering hood has separating webs running perpendicular to the baseplate on the inside, the separating webs being constructed so that they screen the light conductors from one another.

2. A semiconductor arrangement as defined in claim 1, and comprising seven plate-shaped extensions as light conductors, the end surfaces of which form a ⊟ in plan view.

3. A semiconductor arrangement as defined in claim 1, wherein the end surfaces of said light conductors are roughened.

4. A semiconductor arrangement as defined in claim 1, wherein said light conductors are in contact, at least at their inner side facing the other light conductors directly with said contact strip.

5. A semiconductor arrangement as defined in claim 1, and comprising glass powder added to said plastic substance for the purpose of scattering light in said light conductors.

6. A semiconductor arrangement as defined in claim 5, wherein said plastic substance comprises polycarbonate to which 2 to 4% glass powder are added.

7. A semiconductor arrangement as defined in claim 1, wherein said contact strip is burnished on its surface facing the components by means of a burnished silver layer.

8. A semiconductor arrangement as defined in claim 1, wherein said contact strip defines hollows impressed into said contact strip at those points provided for receiving the components, said recesses forming a reflector for the rays of light emanating from a component.

9. A semiconductor arrangement as defined in claim 1 wherein said baseplate defines notches at its side surfaces which rest in notches in said casing hood.

10. A semiconductor arrangement as defined in claim 1, wherein said baseplate has projections at its side surface which rest in notches in said casing hood.

11. A semiconductor arrangement as defined in claim 1, wherein said casing hood is formed in a colour tone which increases the contrast.

12. A semiconductor arrangement as defined in claim 1, and comprising a filter plate so constructed that when the components are not illuminating, the light conductors are not visible or are only faintly visible.

13. A semiconductor arrangement as defined in claim 11, wherein said filter plate is roughened on one side and comprises a mixture of approximately 10% glass powder and approximately 90% polycarbonate and a small proportion of colour pigment.

14. A semiconductor arrangement as defined in claim 11, and comprising a cut-on or edge filter as a filter plate for red and yellow illuminating semiconductor components.

15. A semiconductor arrangement as defined in claim 11, and comprising an interference filter as a filter plate for green illuminating components.

16. A semiconductor arrangement for indicating digits by means of semiconductor illuminating elements, characterized in that the illuminating elements are arranged on a structured contact strip and are electrically connected to parts of said contact strip; that said contact strip is embedded in a homogeneous plastic substance with the exception of the outer connecting parts, said plastic substance forming a baseplate having plate-shaped extensions running perpendicular to the baseplate, wherein said plate-shaped extensions acting as light conductors are arranged over said illuminating elements; that narrow webs running along said supported base plate for supporting said light conductors on their inner side with respect to one another are provided; and that a casing hood is provided for terminating the whole arrangement, said casing hood being provided with a filter plate as a covering plate.

17. A semiconductor arrangement as defined in claim 16, wherein said support webs for four lightconductors forming a square are constructed in star shape.

18. A semiconductor arrangement as defined in claim 16, wherein said casing hood has separating webs running perpendicular to the baseplate on the inside, the separating webs being constructed so that they screen the light conductors from one another.

19. A semiconductor arrangement for producing illuminated characters comprising: a structured contact strip; a plurality of liminescent semiconductor elements mounted on the strip for electrical connection therewith by first electrodes; means connecting second electrodes of said semiconductor elements to another part of said strip; a homogeneous plastic material embedding said contact strip and said semiconductor elements, but leaving outer connecting parts protruding, and forming a common base plate and a separate light conductor above each said semiconductor element, with each said light conductor extending substantially perpendicular to said base plate; and a casing hood surrounding said base plate and said light conductors, said casing hood having a plurality of inner webs which extend perpendicular to said base plate between said light conductors to screen same from one another.

* * * * *